United States Patent [19]
Rao

[11] Patent Number: 5,583,822
[45] Date of Patent: * Dec. 10, 1996

[54] SINGLE CHIP CONTROLLER-MEMORY DEVICE AND A MEMORY ARCHITECTURE AND METHODS SUITABLE FOR IMPLEMENTING THE SAME

[75] Inventor: G. R. Mohan Rao, Dallas, Tex.

[73] Assignee: Cirrus Logic, Inc., Fremont, Calif.

[ * ] Notice: The term of this patent shall not extend beyond the expiration date of Pat. No. 5,473,573.

[21] Appl. No.: 551,526

[22] Filed: Nov. 1, 1995

Related U.S. Application Data

[63] Continuation of Ser. No. 239,608, May 9, 1994, Pat. No. 5,473,573.

[51] Int. Cl.$^6$ .............................. G11C 8/00; G06F 15/20
[52] U.S. Cl. .............................. 365/230.03; 365/230.06; 345/188
[58] Field of Search ................ 365/230.03, 230.06; 345/188, 193, 200

[56] References Cited

U.S. PATENT DOCUMENTS

| | | | |
|---|---|---|---|
| 4,570,242 | 2/1986 | Nagami | 365/222 |
| 4,608,666 | 8/1986 | Uchida | 365/182 |
| 5,117,492 | 5/1992 | Nash | 395/400 |
| 5,159,572 | 10/1992 | Morton | 365/230.03 |
| 5,161,221 | 11/1992 | Van Nostrand | 395/425 |
| 5,200,925 | 4/1993 | Morooka | 365/219 |
| 5,245,585 | 9/1993 | Voss et al. | 365/238.5 |
| 5,265,231 | 11/1993 | Nuwayser | 395/425 |
| 5,278,801 | 1/1994 | Dresser et al. | 365/230.02 |
| 5,287,527 | 2/1994 | Delph et al. | 365/230.01 |
| 5,329,490 | 7/1994 | Murotani | 365/222 |
| 5,353,402 | 10/1994 | Lau | 395/162 |
| 5,377,154 | 12/1994 | Takasugi | . |
| 5,383,193 | 1/1995 | Pathak et al. | 365/201 X |
| 5,388,073 | 2/1995 | Usami et al. | 365/230.03 |
| 5,426,753 | 6/1995 | Moon | 365/230.03 X |
| 5,452,257 | 9/1995 | Han | 365/230.03 |
| 5,473,573 | 12/1995 | Rao | 365/230.06 X |
| 5,477,503 | 12/1995 | Wilson | 365/230.03 |

Primary Examiner—David C. Nelms
Assistant Examiner—Huan Hoang
Attorney, Agent, or Firm—Winstead Sechrest & Minick, P.C.

[57] ABSTRACT

A method is provided for operating a memory including a plurality of blocks of memory cells and a plurality of address decoders, each address decoder allowing access to selected cells in a corresponding one of the blocks in response to selected row and column address bits presented substantially simultaneously on an associated address bus. A first set of row and column address bits are presented on the address bus to access selected cells in a first selected one of the blocks via an associated data bus coupled to each of the blocks. A second set of row and column address bits are then presented on the address bus to access selected cells in a second selected one of the blocks via the data bus.

14 Claims, 1 Drawing Sheet

SINGLE CHIP CONTROLLER-MEMORY DEVICE AND A MEMORY ARCHITECTURE AND METHODS SUITABLE FOR IMPLEMENTING THE SAME

This is a continuation, of application Ser. No. 08/239,608 filed May 9, 1994 now U.S. Pat. No. 5,473,573.

TECHNICAL FIELD OF THE INVENTION

The present invention relates in general to digital electronic circuits and systems and in particular to a single chip controller-memory device and a memory architecture suitable for implementing the same.

BACKGROUND OF THE INVENTION

A typical processing system with video/graphics display capability includes a central processing unit (CPU), a display controller coupled with the CPU by a system bus, a system memory also coupled to the system bus, a frame buffer coupled to the display controller by a local bus, peripheral circuitry (e.g., clock drivers and signal converters), display driver circuitry, and a display unit. The CPU generally provides overall system control and, in response to user commands and program instructions retrieved from the system memory, controls the contents of graphics images to be displayed on the display unit. The display controller, which may for example be a video graphics architecture (VGA) controller, generally interfaces the CPU and the display driver circuitry, exchanges graphics and/or video data with the frame buffer during data processing and display refresh operations, controls frame buffer memory operations, and performs additional processing on the subject graphics or video data, such as color expansion. The display driver circuitry converts digital data received from the display controller into the analog levels required by the display unit to generate graphics/video display images. The display unit may be any type of device which presents images to the user conveying the information represented by the graphics/video data being processed. The "display" may also be a printer or other document view/print appliance.

The frame buffer stores words of graphics or video data defining the color/gray-shade of each pixel of an entire display frame during-processing operations such as filtering or drawing images. During display refresh, this "pixel data" is retrieved out of the frame buffer by the display controller pixel by pixel as the corresponding pixels on the display screen are refreshed. Thus, the size of the frame buffer directly corresponds to the number of pixels in each display frame and the number of bits (Bytes) in each word used to define each pixel. In a standard VGA system, each frame consists of 640 columns and 480 rows of pixels and each pixel is defined by 8 bits, the frame buffer must have a minimum capacity of 307,200 Bytes. For larger displays, such as a 1280 by 1024 display, approximately 1.5 MBytes or more of memory space is required. The required size of the frame buffer only further increases if more bits are used to define each pixel. It should be recognized that the size and performance of frame buffer 104 is dictated by a number of factors such as, the number of monitor pixels, the monitor DOT clock rate, display refresh, data read/write frequency, and memory bandwidth, to name only a few.

Most frame buffers are constructed from random access memory devices (RAMs). Currently available RAM devices unfortunately have limitations on their use, mostly as a result of trade-offs that had to be made during their design and fabrication. Primarily due to expense and fabrication yields, RAM manufacturers are limited in the number of storage locations (cells) which can be provided on a single integrated circuit. Further, design tradeoffs must be made in the interests of minimizing the number of data and address pins, minimizing the number of devices required for a given memory system, and of optimizing the width of the data and address ports. For example, a 4 Mbit (0.5 Mbyte) RAM can be arranged as 4M×1 (i.e. storing 4 million 1-bit words), 1M×4, 512K×8, 256K×16, or 128K×32 (storing 128 thousand 32-bit words) device. At the one extreme, the 4M×1 architecture only allows access to a single bit per address thereby necessitating the use of 32 devices to completely service a 32-bit data bus. This construction disadvantageously consumes valuable board space. At the other extreme, a single 128K×32 device can service a 32-bit bus however the overall word storage capacity is relatively small and each chip/package requires 32 data pins alone along with 17 additional address pins (not to mention power, control, and feature pins). The need for a total of 39 data and address pins increases the size of the chip (as well as its package) due to minimum size requirements on each connection between the chip and its package and the need for level translator (driver) circuits to drive each such connection. As a consequence, RAM manufacturers have generally adopted the more practical architectures, such as the 256K×16 architecture. Even with the 256K×16 architecture however two devices are still required to service a 32-bit bus (or four to service a 64-bit bus) and each device still requires 18 address and 16 data pins for a 256K deep memory (which is very limited).

Proposals have been put forth to put not only the entire frame buffer on a single chip but to also add the controller to the chip. A single controller/memory device would reduce the required board space and would eliminate the need for interconnection pins entirely. The primary obstacle to implementing these proposals has been the inability to solve the problem of achieving good yield during the chip manufacturing process. A state-of-the-art controller is normally fabricated using random logic circuitry which results in a typical die sort (fabrication) yield of 60–70%. Random logic circuitry is generally not "repairable." A memory however is usually fabricated as an array of rows and columns of memory cells. The repetitive nature of memory arrays allows for columns and rows containing defective cells to be "repaired" by substitution with redundant rows and columns provided on the chip. With the ability to "repair", the yield for memory devices can be increased. Typically however no more than 2–3% of a given array-are provided as "repair cells" due to cost limitations. Further, in those cases where the memory cells are divided into blocks, the repair cells are typically not transferable from block to block. Therefore, a substantial number of defects in a block of memory cells normally cannot be repaired even if enough repair cells are available in the overall array. Currently, there are no means for accessing only the remaining operational blocks of the memory and thus the entire chip must be discarded in many cases.

Conventional RAMs (dynamic RAMs) also disadvantageously employ a multiplexed addressing system. During a memory access, row address bits are sent to each DRAM on the address bus and latched into each device address decoder in response to a row address strobe (RAS). The column address bits and column address strobe (CAS) are then presented to each DRAM and latched into the corresponding address decoders, after which data can be written to or retrieved from the addressed locations in memory. Besides complicating the timing of the system memory addressing scheme, this process takes two master clocks instead of a single master clock.

Thus, the need has arisen for an architecture which will allow the fabrication of a controller and associated memory as a single integrated circuit with high yields and thus reduced device cost. In particular, such an architecture should allow the fabrication of a display controller and an associated frame buffer on a single chip. Such an architecture should be applicable to memories of differing sizes and an output word arrangements. The need has also arisen for a memory architecture, in which functional portions of an otherwise defective memory chip can still be used. Additionally, such an architecture would preferably eliminate the generation and routing of RAS and CAS signals in DRAM operations. The architecture will also solve, in most cases, the "memory bandwidth" bottleneck to enhance total system performance.

SUMMARY OF THE INVENTION

The principles of the present invention are embodied in a novel memory architecture which provides for the isolation of defective memory cells such that a substantial number of the remaining operational cells can be used. Further, memories employing the principles of the present invention do not require the generation and routing of row address strobe (RAS) and column address strobe (CAS) signals and allow for the flexible use of the available memory space on a block by block basis, depending on the user's needs. It should be noted however that the present inventive architecture may be used with a traditional RAS/CAS clock scheme, if desired. Memory architectures according to the present inventive concepts are particularly suitable for implementing a controller and a memory device on a single chip.

In accordance with one embodiment of the present invention, a processing device is provided, disposed on a single chip, which includes a controller coupled to an address bus and a data bus, and a memory. The memory includes a plurality of independently addressable blocks of memory cells, each of the blocks coupled to the address bus and having a selected number of output lines coupled to the data bus. The controller accesses a location comprising the selected number of the memory cells of a selected one of the blocks through an address presented on the address bus.

Another embodiment of the present invention is a memory which includes a plurality of blocks of memory cells, each block having a plurality of storage locations each for storing n-bit words of data and n number of data lines. An address decoder is coupled to each of the blocks, this address decoder allows access through the data lines of a selected location in the corresponding block in response to a received address.

According to a further embodiment of the present invention, an integrated circuit is provided which includes a controller, a j-bit wide address bus coupled to an address port of the controller, an m-bit wide data bus coupled to a data port of the controller, and a memory. The memory includes z number of blocks of memory cells, the cells of each block organized as an array of x number of rows and y number of columns, each of the blocks having n number of data lines coupled to the data bus. The memory also includes z number of address decoders coupled to the address bus, each of the decoders being coupled to a corresponding block such that an address provided to the decoders allows access to an n-bit storage location of at least one of the blocks via the n number of data lines of such at least one block.

According to yet another embodiment of the present invention, a processing system is provided which includes a central processing unit, a system bus coupled to the central processing unit, display generation apparatus and display control circuitry disposed on a single chip and coupled to the system bus and the display apparatus. The single chip display control circuitry includes a display controller, an l-bit wide address bus coupled to an address port of the controller, an m-bit wide data bus coupled to a data port of the controller, and a frame buffer. The frame buffer includes z number of blocks of memory cells, the memory cells of each block organized as an array of x number of rows and y number of columns, with each block having n number of data lines coupled to the data bus. The frame buffer also includes z number of address decoders coupled to the address bus, each of the decoders coupled to a corresponding block such that an address provided to the decoders allows access to an n-bit storage location within at least one of the blocks via the n number of data lines associated with such at least one block.

A method of isolating defects in a memory is also provided according to the principles of the present invention. An array of memory cells is partitioned into a plurality of blocks of memory cells. Each block of memory cells is provided with n number of data lines for exchanging data with n-bit locations with each block. A unique range of memory addresses is assigned to each block of memory such that n-bit words can be exchanged with the n-bit locations of operational ones of the blocks by presenting addresses to the memory array which are assigned to the operational blocks of the memory array.

Memory and memory-controller devices embodying the principles of the present invention have substantial advantages over the prior art. In particular, the partitioning of the memory into separately addressable blocks of cells is particularly advantageous. Among other things, defective cells may be isolated on a block by block basis, even after maximum allowable repair, such that remaining operational blocks may still be used. Further, the use of independently addressable blocks of memory allows the user, through software control, to optimize memory usage, which for example cuts down on refresh time. Further, the addressing scheme of the present invention (and in particular when used in a single chip memory-controller device) employs a single address word containing both row and column address bits per access eliminates the need for the generation and routing of row address strobe (RAS) and column address strobe (CAS) signals.

The foregoing has outlined rather broadly the features and technical advantages of the present invention in order that the detailed description of the invention that follows may be better understood. Additional features and advantages of the invention will be described hereinafter which form the subject of the claims of the invention. It should be appreciated by those skilled in the art that the conception and the specific embodiment disclosed may be readily utilized as a basis for modifying or designing other structures for carrying out the same purposes of the present invention. It should also be realized by those skilled in the art that such equivalent constructions do not depart from the spirit and scope of the invention as set forth in the appended claims.

BRIEF DESCRIPTION OF THE DRAWINGS

For a more complete understanding of the present invention, and the advantages thereof, reference is now made to the following descriptions taken in conjunction with the accompanying drawings, in which.

DETAILED DESCRIPTION OF THE INVENTION

Figure 1:
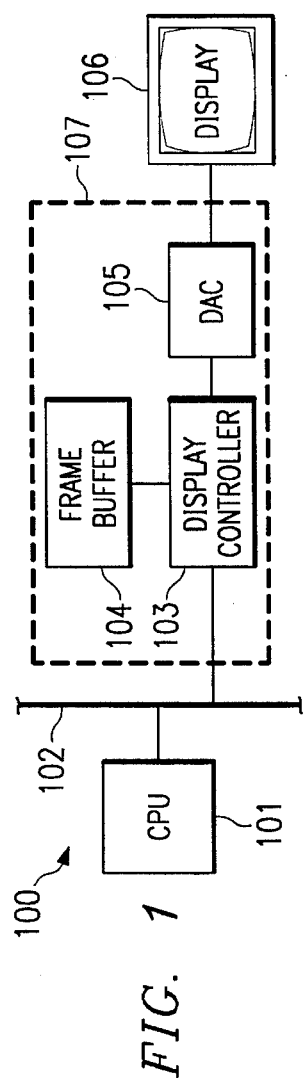
FIG. 1 is a functional block diagram of a processing system including a frame buffer-controller single chip device according to the principles of the present invention.

FIG. 1 is a high level functional block diagram of the portion of a processing system 100 controlling the display of graphics and/or video data. System 100 includes a central processing unit 101, a system bus 102, a display controller 103, a frame buffer 104, a digital to analog converter (DAC) 105 and a display device 106. According to the principles of the present invention, display controller 103 and frame buffer 104 and DAC 105 are fabricated together on a single integrated circuit chip 107.

CPU 101 controls the overall operation of system ("master") 100, determines the content of graphics data to be displayed on display unit 106 under user commands, and performs various data processing functions. CPU 101 may be for example a general purpose microprocessor used in commercial personal computers. CPU 101 communicates with the remainder of system 100 via system bus 102, which may be for example a local bus, an ISA bus or a PCI bus. DAC 105 receives digital data from controller 103 and outputs in response the analog data required to drive display 106. Depending on the specific implementation of system 100, DAC 105 may also include a color palette, YUV to RGB format conversion circuitry, and/or x- and y-zooming circuitry, to name a few options.

Display 106 may be for example a CRT unit or liquid crystal display, electroluminescent display (ELD), plasma display (PLD), or other type of display device displays images on a display screen as a plurality of pixels. Further, display 106 may be a state-of-the-art device such as a digital micromirror device or a silicon carbide like device (as described in the January 1994 issue of the IEEE *Spectrum*) which directly accepts digital data. It should also be noted that in alternate embodiments, "display" 106 may be another type of output device such as a laser printer or similar document view/print appliances.

Figure 2:
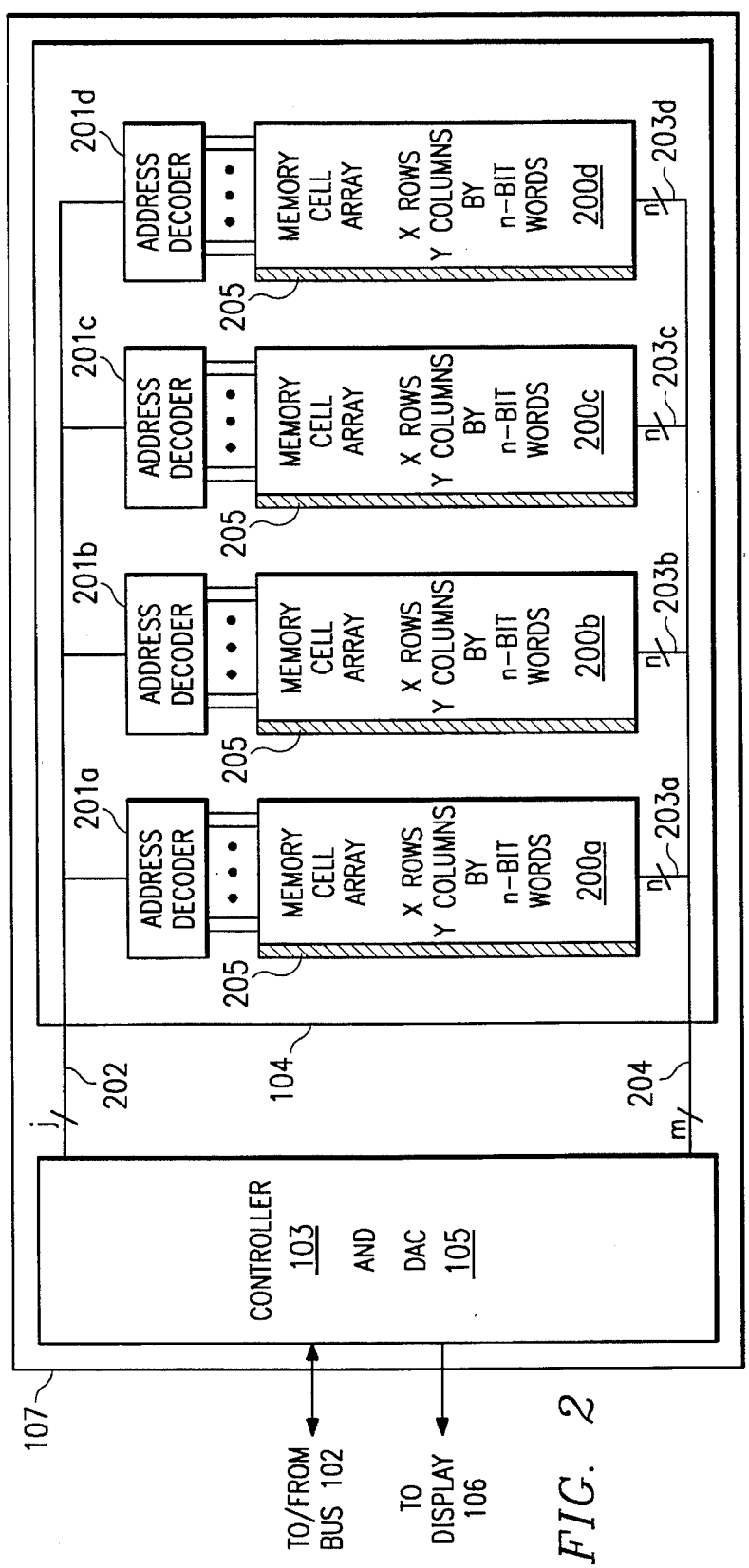
FIG. 2 is a more detailed functional block diagram of the frame buffer-controller device of FIG. 1 emphasizing a memory architecture particularly embodying the principles of the present invention.

FIG. 2 is a block diagram depicting in further detail integrated circuit 107. In FIG. 2, both controller 103 and frame buffer 104 are disposed on integrated circuit 107 within a novel architecture embodying the principles of the present invention. It should be noted that the novel architecture of frame buffer 104 itself is constructed in accordance with the principles of the present invention and demonstrating a manner in which these can be applied to memories with or without the presence of a controller on the same chip.

In the illustrated embodiment, controller 103 is a display controller, such as a VGA controller, which among other things, controls the exchange of graphics and/or video data with frame buffer 103, controls memory refresh, and performs data processing functions such as color expansion. A display controller is the "master" for the specific application of display and thus frees up CPU 101 to perform computational tasks. Moreover, the architecture of a display controller optimizes it to perform graphics and video functions in a manner for superior to that of a general purpose microprocessor. Controller 103 may also include a color palette, cursor generation hardware, and/or video to graphics conversion circuitry, to name a few options. In embodiments employing a display controller, controller 103 could be a Cirrus Logic, Inc. controller of the 52XX or 63XX family.

Except to the extent described herein, the principles of the present invention are not dependant on the specific functional characteristics of controller 103. Thus, in alternate embodiments, controller 103 may be any one of a number of possible other general purpose microprocessor, controllers, or control devices which operate in conjunction with an associated random access memory. In general, controller 103 is a dedicated coprocessor which acquires, stores, manipulates, and outputs large arrays of data to memory. Controller 103 may be of the "bit map" class or of the "format memory" class (as described in the Apr. 18, 1994 issue of *Electronic Design*). Further, the principles of the present invention accommodate mixed-signal control devices on a single chip (die) and consequently, controller 103 may include mixed-signal drivers, clock doublers, phase-locked loops, among other things. In the preferred embodiment, controller 103 is fabricated from random logic.

According to the principles of the present invention, frame buffer 103 is partitioned into a selected number of memory blocks 200. In the illustrated embodiment, four memory blocks 200a–200d are provided each of which contains an array of memory cells arranged as X number of rows and Y number of columns and configured, output a n-bit words per address. Each memory block is associated with an address decoder 201. Addresses of 1 number of bits are provided to each decoder 201 from controller 103 via a j-bit wide address bus 202. Preferably, each decoder 201/ block 200 responds to a different range of addresses in the controller address space. Each memory block includes n number of data lines 203 coupled to controller 103 via an m-bit wide data bus 204. Further, each memory block includes a number of redundant cells 205 (along with peripheral circuits such as sense amplifiers and enable/ disable fuses) for repairing defective cells by substitution. In the preferred embodiment, frame buffer 103 is constructed as a dynamic random access memory (DRAM); however, the present inventive concepts are not limited to DRAMs but may be applied, in alternate embodiments, to other types of memories such as static random access memories (SRAMs), read-only memories (ROMs), electrically erasable programmable read-only memories (EEPROMs), erasable programmable read-only memories (EPROMs).

The memory architecture of frame buffer 104 advantageously provides for flexibility in meeting the memory needs of controller 103, allows for the use of chips in which include substantial areas of defects, even after repair, and allows for optimized refresh time. For example, assuming that memory 104 has a total capacity of 2 Mbytes and each block 200 (in the preferred embodiment) has a storage capacity of 0.5 Mbyte, then controller 103, under software control, can select for use either 2 Mbyte, 1.5 Mbyte, 1 Mbyte or 0.5 Mbytes since each block 200 is assigned a band in the address space of controller 103. Further, if a given block contains defective cells even after the maximum allowed repair, the remaining blocks 200 can still be accessed by generating addresses only to those blocks and not to the defective block. Assuming for example that a 1280 by 1024 display is being used with a resolution of 8 bits per pixels, 1.5 MByte of memory is still sufficient allowing one block 200 to fail before the device 107 could not be used for that application. Additionally, if only some of the blocks 200 are required by controller 103, refresh need only be directed to the active block 200 thereby optimizing refresh time.

The number of output lines 203 from each memory block 200, the size of data bus 204 and the size of the cell array of each memory block 200, as well as the address map, are all flexible to meet the needs of the controller 103. For example, controller 103 may be designed to exchange data with frame buffer 104 via 32-, 64-, or 128-bit wide data bus 204. Depending on the width of bus 204, the parameters for the memory architecture of frame buffer can then be optimized. For illustrative purposes, assume that the overall storage capacity of frame buffer 104 is 2 Mbytes partitioned into four blocks 200 each having a capacity of 0.5 Mbyte. If bus 204 is assumed to be 64 bits wide, then each block could be constructed to have either 16, 32 or 64 data lines 203 for connection to data bus 204. In the case of 16 data lines 203 per block 200, each block 200 would be arranged as a 256K×16 device and all four blocks must be operational and accessed simultaneously to service the entire bus in a single cycle. When each block 200 is provided with 32 data lines, the block would be arranged as a 128K×32 device and only two of the blocks 200 must be operational (after maximum allowable repair) and accessed simultaneously to service the entire bus. If each block 200 is structured as a 64K×64 device with 64 data lines 203 are provided, only one block 200 needs to be operational and accessed to service a 64-bit bus 204. The selection of alternate configurations to service other bus widths is similar.

It should be noted that in alternate embodiments, blocks 200 may be interleaved. For example, if each block 200 has 64 data lines coupled to a 64-bit data bus 204, a sequence of 64-bit words could be accessed by sequentially addressing the blocks 200 (i.e., such that words in the sequence are accessed sequentially from two or more blocks 200). As another example, assuming again a 64-bit bus 204 and 64 data lines per block 200, a portion of 64 bit words could be accessed from different blocks 200 (i.e., one 32-bit word could be accessed from a first block 200 and a second 32-bit word accessed from a second block 200).

As indicated above, in the preferred embodiment, each block 200 and its associated address decoder 201 accommodate a different address range in the address space of processor 103. Further, a selected storage location within a selected block is addressed by a single address word; the ability to place controller 103 on the same chip as frame buffer 204 allows for sufficient lines to be run therebetween (without the need for level translators, and internal pins with their required spacing) such that both row and column address bits can be simultaneously presented to the address decoders 201. This feature eliminates the need for a multiplexed address bus and consequently the need to generate row address strobe (RAS) and column address strobe (CAS) signals.

The width of the address bus 202 is dependant on the number, size, and structure of the memory blocks 200. For example, when 256K×16 blocks are used, each 16-bit location in a given block 200 is accessed by an 18-bit address. If 128K×32 blocks are used, each 32-bit location is accessed by 17 bit address and, if 64K×64 blocks are used, each 64-bit location is accessed by a 16-bit address. In the illustrated embodiment where frame buffer 104 includes four memory blocks 200a–200d, two additional most significant bits are added to each address as block select bits. The number of block select bits will change in alternate embodiments depending on the number of blocks 200 employed.

The row/column structure of blocks 200 is also flexible; the number of bits desired per location equals the number of rows divided by the number of columns. Further, the number of row and column address bits per each address is dependant on the respective number of rows and columns. For example, each block is arranged as 2048 rows and 128 columns to provide 256K locations of 16 bits. The 18-bit address to each location in a block consequently includes 11 row address bits and 7 column address bits. A block 200 of 2048 rows and 64 columns will provide 128K locations of 32 bits each and addressed by 11 row and 6 column address bits. As a final example, a block 200 arranged as 2048 rows and 32 columns will provide 64K 64-bit locations each addressed by 11 rows and 5 column address bits. Numerous other combinations are possible.

In sum, memories, such as frame buffer 104 illustrated herein, employing an architecture according to the principles of the present invention have substantial advantages over the prior art. Among other things, the use of multiple independently address blocks allows for the isolation of a block with defective cells (after maximum repair) through address generation such that the remaining functional blocks can still be used. Further, the use of individually addressed blocks allows for the optimization of memory use; if only a portion of the capacity of memory 104 is required, processor 104, under software control, addresses only those blocks required access the required amount of memory space. In this case, refresh time can be reduced since only the active blocks will require refreshing. Finally, the ability to isolate faulty blocks, and thereby preserve the remaining operation blocks, allows the memory to be used in such applications as the combination controller-frame buffer device 107 where fabrication yield is critical.

The combination of controller 103 and frame buffer 104 on a single chip also has substantial advantages over the prior art. First, a single packaged integrated circuit takes up less board space (i.e. has a smaller form factor or "footprint") than two or more packaged chips. Second, the single chip controller/memory embodiment eliminates both the number of internal and external pins normally required to electrically connect devices disposed on separate chips. According to the present invention, lines are simply run directly from circuit to circuit on the chip. Besides reducing inductive/capacitive loading on the corresponding driving circuitry, the elimination of the internal pins also allows for the chip size to be reduced and eliminates the need for the drivers normally required for chip to chip transmission. It should be noted that typically an internal pin is 50 μm wide and is spaced from neighboring pins by 50 μm. Lines directly run on the chip are typically only 1 μm wide and require only 1 μm spacing from each other. Further, because of the elimination of the pins and because the lines can be more efficiently (densely) run on a single chip, more address lines can be run from the controller to the memory. In the case of DRAMs, multiplexed address buses and the need to generate RAS and CAS signals are eliminated. Finally, the principles of the present invention enhance manufacturers productivity by offering "combination" solutions with one controller having various sizes of memory associated therewith—which is not possible with discrete solutions at the same cost.

Although the present invention and its advantages have been described in detail, it should be understood that various changes, substitutions and alterations can be made herein without departing from the spirit and scope of the invention as defined by the appended claims.

What is claimed is:

1. A method of generating display images comprising the steps of:

writing digital display data into selected cells in selected blocks of a multi-block memory, each block associated with a dedicated address decoder for allowing access to selected cells therein in response to selected row and column address bits presented substantially simultaneously on an associated address bus;

presenting a first set of row and column address bits on the address bus to read digital data written into selected cells of a first selected one of the blocks via an associated data bus coupled to each the blocks;

presenting a second set of row and column address bits on the address bus to read digital data written selected cells in a second selected one of the blocks via the data bus; and converting the digital data read from the first and second blocks into analog data for driving a display device.

2. The method of claim 1 wherein the digital data read from the first and second blocks is in a YUV format and the method further comprises the step of converting the YUV data read from the first and second blocks into RGB data.

3. The method of claim 1 and further comprising the step of selectively zooming the data read from the first and second blocks.

4. The method of claim 1 wherein said steps of writing and presenting are performed by a display controller integral with the memory.

5. A method of operating an integrated controller—memory device, the device including a controller, a plurality of blocks of memory cells, and a plurality of address decoders, each address decoder allowing access to selected cells in a corresponding one of the blocks in response to selected row and column address bits presented substantially simultaneously on an associated address bus by the controller, the method comprising the steps of:

presenting a first set of row and column address bits on the address bus with the controller;

accessing selected cells in a first selected one of the blocks in response to the first set of address bits via an associated data bus coupled to each the blocks;

presenting a second set of row and column address bits on the address bus with the controller; and accessing selected cells in a second selected one of the blocks via the data bus in response to the second set of address bits.

6. The method of claim 5 wherein the steps of presenting are performed sequentially to implement an interleaved access of the first and second blocks.

7. The method of claim 5 wherein the steps of presenting are performed substantially concurrently and the steps of accessing are performed substantially simultaneously, wherein each of the first and second blocks is accessed via to respective first and second portions of the data bus.

8. The method of claim 5 wherein the integrated device further includes a digital to analog converter and the method includes the step of converting digital data read from the selected blocks during read accesses into analog data.

9. A method of operating a memory including a plurality of blocks of memory cells and a plurality of address decoders, each address decoder allowing access to selected cells in a corresponding one of the blocks in response to selected row and column address bits presented substantially simultaneously on an associated address bus, the method comprising the steps of:

presenting a first set of row and column address bits on the address bus to access selected cells in a first selected one of the blocks via an associated data bus coupled to each the blocks; and presenting a second set of row and column address bits on the address bus to access selected cells in a second selected one of the blocks via the data bus.

10. The method of claim 9 wherein said steps of presenting address bits are performed to effectuate interleaved accesses from the first and second selected blocks.

11. The method of claim 10 wherein the data bus is n-bits wide and each of the interleaved accesses an n-bit location in the corresponding selected block.

12. The method of claim 9 wherein said steps of presenting effectuate substantially simultaneous accesses to the first and second selected blocks.

13. The method of claim 12 wherein said first and second sets of addresses are presented substantially simultaneously on the address bus.

14. The method of claim 12 wherein the data bus has a predetermined width and the first and second accesses are each to a number of cells representing a portion of the width of the bus.

* * * * *